United States Patent
Lautzenhiser et al.

[11] Patent Number: 6,164,522
[45] Date of Patent: Dec. 26, 2000

[54] METHOD OF MANUFACTURING A THICK FILM CIRCUIT WITH CONSTRAINED ADHESIVE SPREADING

[75] Inventors: Frans Peter Lautzenhiser, Noblesville; John Karl Isenberg, Rossville, both of Ind.

[73] Assignee: Delphi Technologies, Inc., Troy, Mich.

[21] Appl. No.: 09/384,892

[22] Filed: Aug. 27, 1999

Related U.S. Application Data

[63] Continuation-in-part of application No. 09/106,788, Jun. 29, 1998, Pat. No. 6,007,867.

[51] Int. Cl.[7] .............................. B05D 5/12; B23K 31/02
[52] U.S. Cl. ....................... 228/175; 228/179.1; 228/215; 427/96; 427/258; 427/384; 427/402; 29/840
[58] Field of Search ..................................... 228/175, 118, 228/180.5, 179.1, 215, 4.1, 13; 42/96, 258, 384, 402

[56] References Cited

U.S. PATENT DOCUMENTS

| | | |
|---|---|---|
| 4,056,415 | 11/1977 | Cook, Jr. et al. . |
| 4,755,911 | 7/1988 | Suzuki et al. . |
| 4,880,567 | 11/1989 | Prabhu et al. . |
| 4,899,439 | 2/1990 | Potter et al. . |
| 5,716,713 | 2/1998 | Zsamboky et al. . |
| 5,910,334 | 6/1999 | Lautzenhiser et al. . |
| 6,008,540 | 12/1999 | Lu et al. . |

*Primary Examiner*—Patrick Ryan
*Assistant Examiner*—Colleen Cooke
*Attorney, Agent, or Firm*—Jimmy L. Funke

[57] ABSTRACT

An improved method of manufacturing thick film circuit wherein an IC is attached to a central conductor pad with adhesive, and wherein spreading of the adhesive is constrained by a ring of porous dielectric material formed between the central conductor pad and the peripheral conductor pads to which the IC terminals are bonded. When the adhesive material is printed and begins to spread, it contacts the porous dielectric ring, which absorbs the adhesive material and stops the spreading. In this way, the porous dielectric ring controls the dimensions of the cured adhesive, thereby preventing the adhesive from contaminating the peripheral conductor pads. Even with the addition of the intervening dielectric ring, the length of the wire-bond connections and the overall dimension of the IC and its conductor pads are both significantly decreased, contributing to improved circuit area utilization and wire-bond durability.

4 Claims, 2 Drawing Sheets

METHOD OF MANUFACTURING A THICK FILM CIRCUIT WITH CONSTRAINED ADHESIVE SPREADING

RELATED APPLICATION

This application is a continuation-in-part of U.S. Pat. No. 6,007,867, filed Jun. 29, 1998 now U.S. Pat. No. 6,007,867, assigned to the assignee of the present invention, and entitled "Method of Manufacturing a Thick Film Circuit With Improved Dielectric Feature Definition".

TECHNICAL FIELD

This invention relates to the manufacture of thick film circuits, and more particularly to a method of constraining the spreading of adhesive as a means of minimizing circuit dimensions.

BACKGROUND OF THE INVENTION

In the manufacture of thick film circuits, adhesives are customarily used for the attachment of discrete integrated circuit (IC) devices to conductor pads formed on the a dielectric layer of the circuit. The IC terminals formed on the exposed side of the device are then attached by wire-bonding to a number of conductor pads surrounding the IC.

A problem with circuits of the above description is that the adhesive tends to spread beyond the intended print pattern during curing, to the point of contaminating the surrounding conductor pads and interfering with subsequent wire-bonding operations. While the problem can be solved by simply increasing the distance between the IC and the surrounding conductor pads, this undesirably increases the circuit area required to mount the IC. Furthermore, the increased wire-bond connection length tends to be detrimental to circuit durability, particularly when the circuit is subjected to mechanical shock. Accordingly, what is needed is a method of manufacture that constrains the adhesive spreading so that the circuit dimensions and wire-bond lengths can be minimized.

SUMMARY OF THE INVENTION

The present invention is directed to an improved method of manufacturing thick film circuit wherein an IC is attached to a central conductor pad with adhesive, and wherein spreading of the adhesive is constrained by a ring of porous dielectric material formed between the central conductor pad and the peripheral conductor pads to which the IC terminals are bonded. When the adhesive material is printed or dispensed and begins to spread, it contacts the porous dielectric ring, which absorbs the adhesive material and stops the spreading. In other words, the porous dielectric ring controls the dimensions of the cured adhesive, thereby preventing the adhesive from contaminating the peripheral conductor pads.

Even with the addition of the intervening dielectric ring, the length of the wire-bond connections and the overall dimension of the IC and its conductor pads are both significantly decreased, contributing to improved circuit area utilization and wire-bond durability.

DESCRIPTION OF THE PREFERRED EMBODIMENT

Figure 1:
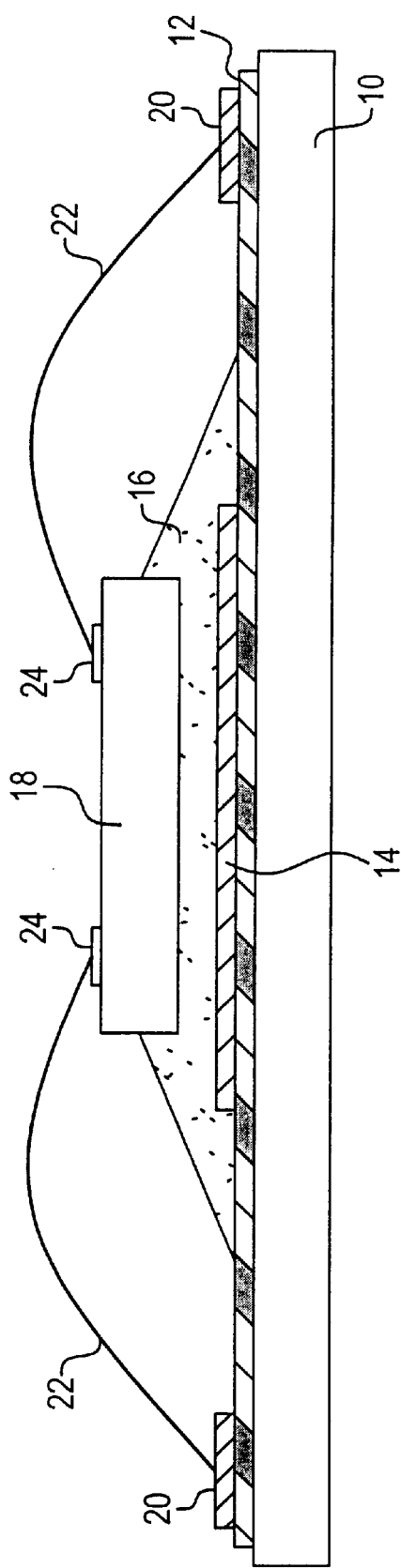
FIG. 1 depicts in cross-section a thick film circuit manufactured according to conventional techniques.
Figure 2:
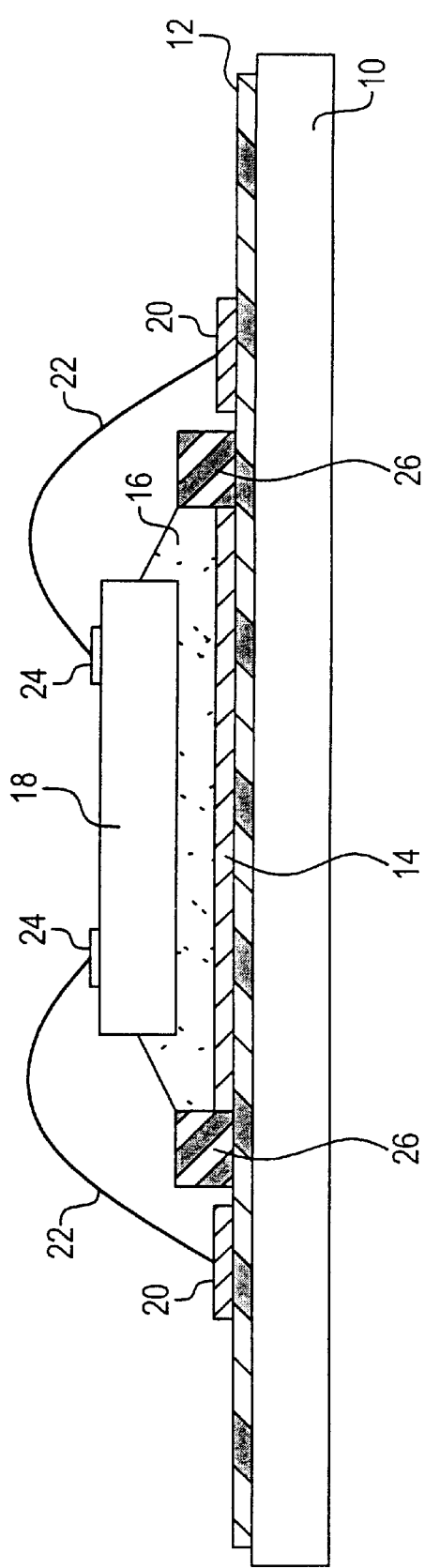
FIG. 2 depicts in cross-section a thick film circuit manufactured according to this invention.
Figure 3:
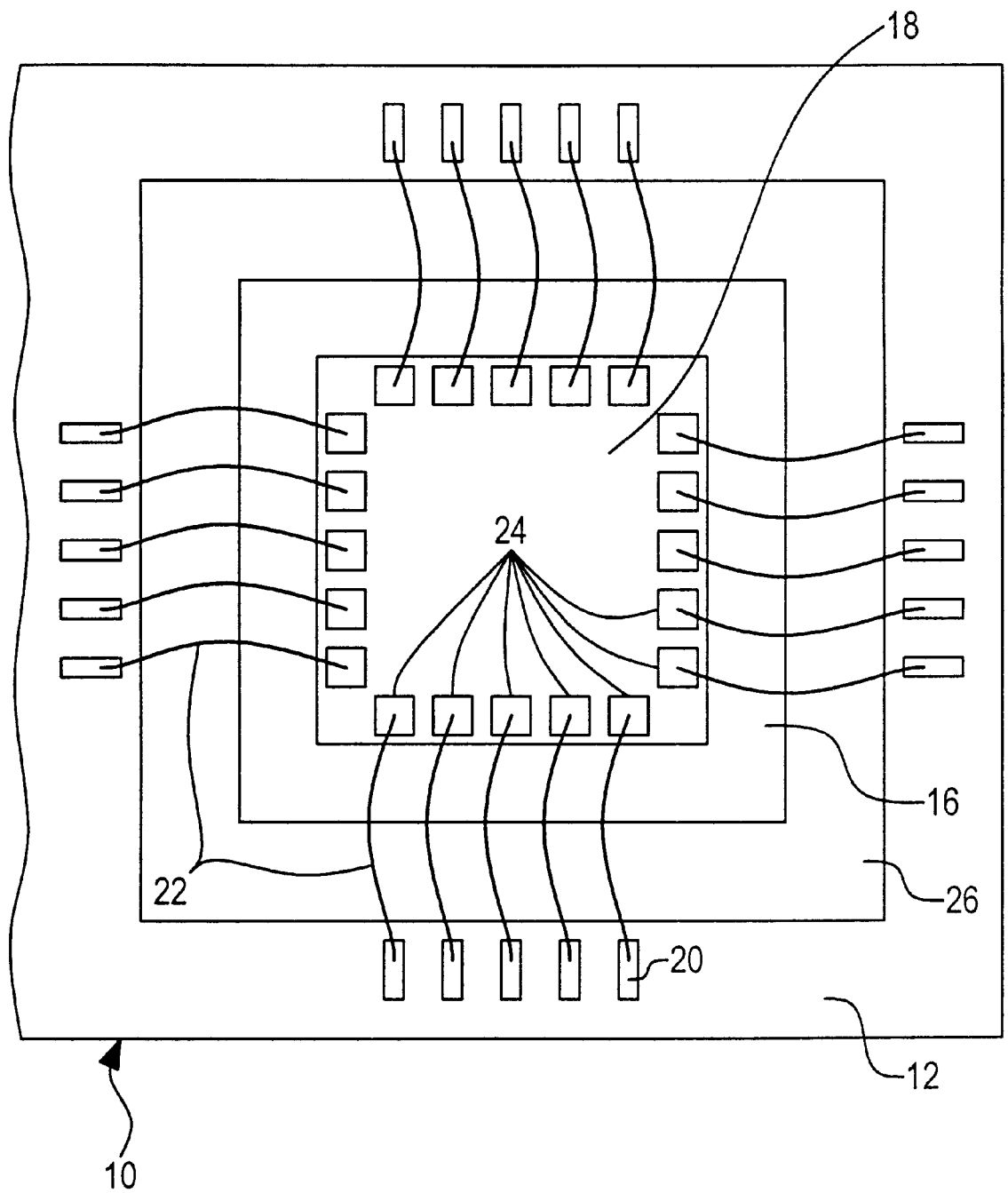
FIG. 3 is a top view of the thick film circuit of FIG. 2.

FIGS. 1 and 2 depict, on a comparable scale, circuits respectively manufactured according to the prior art and according to this invention. In each case, the reference numeral 10 designates a ceramic substrate, the reference numeral 12 designates a layer of dielectric material formed on the substrate 10, the reference numeral 14 designates a central conductor pad, the reference numeral 16 designates a conductive adhesive material, and the reference numeral 18 designates an IC device (such as a microprocessor) which is conductively attached to the central conductor pad 14 by means of the adhesive material 16. Also in each case, a number of peripheral conductor pads 20 are formed on the dielectric layer 12 around the IC 18 (as best seen in FIG. 3) and wire-bond leads 22 are used to couple the pads 20 to corresponding terminal pads 24 on the exposed side of IC 18. In certain applications, the entire circuit is covered with a passivation material, such as Sylgard or Parylene (not shown). For convenience, the vertical scale in the cross-section diagrams of FIGS. 1–2 has been exaggerated by a factor of approximately two, compared to the horizontal scale.

In the prior art manufacturing method, the adhesive material 16 is printed atop the central conductor pad 14 over an area substantially equal to the IC 18, and the IC 18 is pressed into the adhesive material 16 to ensure good adhesion and proper orientation. The material 16 wells up around the sides of the IC 18, and then spreads laterally during the curing process. Due to process variability, the material 16 spreads laterally to a greater or lesser extent than shown, and the peripheral pads 20 are placed well away from the IC 18 to ensure that the adhesive 16 will not contaminate the pads 20. This not only takes up a significant amount of space, but also results in relatively long wire-bond leads 22, which is undesirable from a durability standpoint.

According to the present invention, however, adhesive spreading is constrained by a ring of porous dielectric material 26 formed on the dielectric layer 12 intermediate the central conductor pad 14 and the peripheral conductor pads 20. The dielectric ring 26 is printed and fired prior to the printing of the adhesive material 16. See FIGS. 2 and 3. When the material 16 is deposited on the central conductor 14 and the IC is properly positioned, the material 16 wells up and begins to spread as explained above in reference to FIG. 1. In this case, however, the material 16 does not spread beyond the dielectric ring 26 due to the porosity of the ring 26. The adhesive material 16 includes a liquid medium and a solid medium; the liquid medium comprises a solvent, resins and surfactants, while the solid medium comprises powdered solids. Due to the porous nature of the dielectric ring, it absorbs liquid medium from the adhesive 16 like a sponge. This reduces the liquid fraction of the material, thereby increasing its viscosity, and inhibiting the spreading of the material beyond the ring 26. As a result, the peripheral pads 20 may be placed in close proximity to the ring 26 with no fear of contamination due to adhesive spreading. This significantly reduces the circuit area utilized to form the IC connections, and at the same time, significantly reduces the length of the wire-bond leads 22. When compared with conventional processes, a circuit manufactured according to the method of FIGS. 2–3 requires 15% less circuit area, and the wire-bond lengths are reduced by 35%.

In general, dielectric paste compositions that retain their porosity after firing comprise an inorganic filler having a high melting temperature to minimize densification at a firing temperature of 850° C., a glass component, and an organic vehicle to facilitate screen printing. Porosity of the fired dielectric is enhanced by selecting the ratio of inorganic filler to glass such that during firing, the glass bonds the filler particles together without filling in the interstitial areas. Other conventional considerations include filler-to-glass weight ratio, particle size, and dielectric constant.

Of course, it will be understood that various dielectric paste formulations may satisfy the above-described characteristics. Nevertheless, the following table describes one formulation satisfying all of the above-noted considerations and characteristics.

| SOLIDS - 75% By Weight | |
|---|---|
| Alumina (AL203) | 83.8% |
| Glass Frit (RRO) | 14.7% |
| Colorant (BG-210) | 2.0% |
| ORGANIC - 25% By Weight | |
| Terpineol | 63.0% |
| Texanol | 20.0% |
| Dodecyl Alcohol | 5.0% |
| Diethylene Glycol Dibutyl Ether | 5.0% |
| Surfactant (Igepal) | 2.0% |
| Binder (N-50 Ethyl Cellulose) | 5.0% |

Fineness of Grind (FOG)–7.5 microns

In summary, the method of this invention significantly reduces both circuit area and wire-bond length in applications where an IC device is mounted on a conductor pad with adhesive. Although described in reference to the illustrated embodiments, it is expected that various modifications will occur to those skilled in the art. For example, the disclosed method can be used on any layer of a multi-layer circuit. Additionally, various formulations other than specifically disclosed herein may be employed, and the process steps may be added or combined in ways well known to those skilled in the art. In this regard, it will be understood that the scope of this invention is not limited to the illustrated embodiments and that methods incorporating such modifications may fall within the scope of this invention, which is defined by the appended claims.

What is claimed is:

1. A method of manufacturing a thick film circuit wherein an IC device is secured to a central conductor pad with adhesive material that tends to spread laterally after being applied to said central conductor pad, and terminal pads on a top surface of the IC device are wire-bonded to peripheral conductor pads disposed about said central conductor pad, the improvement wherein:

prior to applying said adhesive material to said central conductor pad, a ring of dielectric paste is printed and fired intermediate the central conductor pad and the peripheral conductor pads, the dielectric paste being formulated to remain porous after firing, so that liquid constituents in a portion of the adhesive material which spreads laterally beyond the central conductor pad are absorbed by the porous fired dielectric, preventing spreading of the adhesive material onto the peripheral conductor pads.

2. The method of claim 1, wherein the ring of dielectric paste is printed adjacent said central conductor pad, allowing a distance between said central conductor pad and said peripheral pads to be decreased, thereby decreasing a length dimension of said wire-bonds.

3. A method of manufacturing a thick film circuit, comprising the steps of:

forming a central conductor pad and a plurality of peripheral conductor pads about said central conductor pad;

printing a firing a ring of dielectric paste intermediate the central conductor pad and the peripheral conductor pads, the dielectric paste being formulated to remain porous after firing;

applying an adhesive to a portion of said central conductor pad;

placing an IC device on said adhesive to electrically and mechanically couple said IC device to said central conductor pad;

curing said adhesive for a cure interval during which said adhesive spreads laterally to contact said fired ring of dielectric; and wire bonding terminal pads on said IC device to said peripheral conductor pads to electrically couple said IC device to said peripheral conductor pads.

4. The method of claim 3, wherein the ring of dielectric paste is printed adjacent said central conductor pad, minimizing a distance between said central conductor pad and said peripheral pads, thereby minimizing a length dimension of said wire-bonds.

* * * * *